United States Patent
Yaegashi et al.

(10) Patent No.: US 7,728,353 B2
(45) Date of Patent: Jun. 1, 2010

(54) SEMICONDUCTOR DEVICE IN WHICH GAN-BASED SEMICONDUCTOR LAYER IS SELECTIVELY FORMED

(75) Inventors: Seiji Yaegashi, Yamanashi (JP); Takeshi Kawasaki, Yamanashi (JP); Ken Nakata, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 275 days.

(21) Appl. No.: 11/392,549

(22) Filed: Mar. 30, 2006

(65) Prior Publication Data

US 2006/0220042 A1 Oct. 5, 2006

(30) Foreign Application Priority Data

Mar. 31, 2005 (JP) .............................. 2005-105163

(51) Int. Cl.
*H01L 29/20* (2006.01)
*H01L 31/0328* (2006.01)
*H01L 31/0336* (2006.01)
*H01L 31/072* (2006.01)
*H01L 31/109* (2006.01)

(52) U.S. Cl. .................... 257/192; 257/94; 257/194; 257/E29.246

(58) Field of Classification Search .............. 257/94, 257/192, 194, E29.246
See application file for complete search history.

(56) References Cited

U.S. PATENT DOCUMENTS

| 5,557,115 | A  | * | 9/1996 | Shakuda | 257/81 |
| 2001/0040246 | A1 | * | 11/2001 | Ishii | 257/192 |
| 2003/0180977 | A1 | * | 9/2003 | Suzuki et al. | 438/22 |
| 2004/0051112 | A1 | * | 3/2004 | Moon et al. | 257/103 |
| 2005/0023555 | A1 | * | 2/2005 | Yoshida et al. | 257/192 |
| 2005/0145883 | A1 | * | 7/2005 | Beach et al. | 257/194 |
| 2006/0060871 | A1 | * | 3/2006 | Beach | 257/94 |

FOREIGN PATENT DOCUMENTS

JP 11-251253 9/1999
JP 2000-349338 12/2000

* cited by examiner

*Primary Examiner*—Howard Weiss
*Assistant Examiner*—Tifney L Skyles
(74) *Attorney, Agent, or Firm*—Westerman, Hattori, Daniels & Adrian, LLP

(57) ABSTRACT

A semiconductor device includes a mask layer having openings on a substrate, a GaN-based semiconductor layer selectively formed on the substrate with the mask layer that serves as a mask, a gate electrode and either a source electrode or an emitter electrode formed on the GaN-based semiconductor layer, and a drain electrode or a collector electrode connected on a surface of the first semiconductor layer that faces the GaN-based semiconductor layer or an opposite side of the first semiconductor layer.

2 Claims, 8 Drawing Sheets

SEMICONDUCTOR DEVICE IN WHICH GaN-BASED SEMICONDUCTOR LAYER IS SELECTIVELY FORMED

BACKGROUND OF THE INVENTION

1. Field of the Invention

This invention generally relates to semiconductor devices and fabrication methods of the same, and more particularly, to a semiconductor device in which a GaN-based semiconductor layer is selectively formed and a fabrication method of the same.

2. Description of the Related Art

Semiconductor devices having a GaN-based semiconductor or SiC-based semiconductor are used as a power device that operates at high frequencies and high power. As a semiconductor device having the GaN-based semiconductor or SiC-based semiconductor, FET such as HEMT (High Electron Mobility Transistor) or the like, IGBT (Insulated Gate Bipolar Transistor), and MOSFET (Metal Oxide Semiconductor FET) are well known. The GaN-based semiconductor is a single crystal or mixed crystal composed of, for example, at least one of GaN, AlN, and InN.

Here, a description will be given of a process of providing an opening portion in the GaN-based semiconductor device (hereinafter, referred to as conventional technique 1), in fabricating the semiconductor device having a vertical structure with the use of the GaN-based semiconductor. FIG. 1A through FIG. 1C are cross-sectional views of a fabrication process of the conventional technique 1. Referring to FIG. 1A, a GaN-based semiconductor layer 108, which includes a drift layer 102, an electron control layer 104, and a contact layer 106, is formed on a substrate 100.

Referring to FIG. 1B, a photo resist 120 having an opening in a given region is formed. Referring to FIG. 1C, the contact layer 106 is dry etched by the use of $Cl_2$ with the photo resist 102 that serves as a mask, so as to form an opening portion in the contact layer 106. A gate electrode 112 is provided in the opening portion and a source electrode 110 is provided on the contact layer 106. In this manner, the opening portion is formed by etching the GaN-based semiconductor layer 108.

Also, as another technique of forming the GaN-based semiconductor layer, the following arts (hereinafter, referred to as conventional technique 2) are disclosed. According to Japanese Patent Application Publication No. 11-251253, an underlying layer fabricated of the GaN-based semiconductor is formed on the substrate, which is not the GaN-based semiconductor so as to partially provide a protection film on the underlying layer. This discloses the technique of forming the GaN-based semiconductor layer on the underlying layer without the protection film. Japanese Patent Application Publication No. 2000-349338 discloses a technique of forming the mask in strips and providing the GaN-based semiconductor layer to cover the mask.

In the conventional technique 2, however, if the GaN-based semiconductor having a thick drift layer is formed on a sapphire substrate or SiC substrate, for example, a distortion or warp occurs on the substrate. This causes a crack in the substrate or the GaN-based semiconductor layer. Besides, in the fabrication process of the semiconductor device, accuracy in alignment is degraded in the lithography process.

In addition, in the conventional technique 1, while the opening portion is being formed in the GaN-based semiconductor layer, damage is introduced into side walls of the opening portion in the contact layer 106 or a bottom of the opening portion of the electron control layer 104. In a conductive region of the GaN-based semiconductor layer, this damage generates a trap level on a surface of the semiconductor or in the semiconductor, and inactivated carriers and reduces concentrations of electrons and holes. Also, in an insulating region of the GaN-based semiconductor layer, the trap level generated by the damage causes leakage current to flow. With these reasons, the electric characteristics of the semiconductor device will be deteriorated.

SUMMARY OF THE INVENTION

It is an object of the present invention to prevent a warp or distortion in a substrate and to provide a semiconductor device and a fabrication method of the same, which is capable of preventing a crack in a GaN-based semiconductor layer and preventing the degradation in accuracy of alignment in a fabrication process. A more specific object of the present invention is to provide the semiconductor device and the fabrication method of the same, which is capable of preventing damage while an opening portion is being formed in the GaN-based semiconductor layer and preventing the degradation in the electric characteristics.

According to one aspect of the present invention, preferably, there is provided a semiconductor device including: a mask layer having openings on a substrate; a GaN-based semiconductor layer selectively formed on the substrate with the mask layer that is used as a mask; a gate electrode and either a source electrode or an emitter electrode formed on the GaN-based semiconductor layer; and a drain electrode or a collector electrode connected on a surface of the first semiconductor layer that faces the GaN-based semiconductor layer or an opposite side of the first semiconductor layer. In accordance with the present invention, it is possible to provide a semiconductor device that makes it possible to prevent the warp of the substrate, the crack in the GaN-based semiconductor layer, the degradation of accuracy in the alignment in the fabrication process. In addition, it is possible to prevent the damage caused while the opening portion is being formed in the GaN-based semiconductor layer and the deterioration of the electric characteristics.

According to another aspect of the present invention, preferably, there is provided a semiconductor device including: a first semiconductor layer formed on a substrate; a GaN-based semiconductor layer selectively grown on the first semiconductor layer; a gate electrode formed on side faces of the GaN-based semiconductor layer; a source electrode or an emitter electrode formed on the GaN-based semiconductor layer; a drain electrode or a collector electrode connected on a surface of the first semiconductor layer that faces the GaN-based semiconductor layer or an opposite surface of the first semiconductor layer.

According to yet another aspect of the present invention, preferably, there is provided a fabrication method of a semiconductor device including: forming a mask layer having openings on a substrate; forming a GaN-based semiconductor layer selectively on the substrate with the mask layer that is used as a mask; forming a gate electrode and either a source electrode or an emitter electrode on the GaN-based semiconductor layer; and forming a drain electrode or a collector electrode connected on a surface of the first semiconductor layer that faces the GaN-based semiconductor layer or an opposite side of the first semiconductor layer.

According to still another aspect of the present invention, preferably, there is provided a fabrication method of a semiconductor device including: forming a first semiconductor layer on a substrate; forming a mask layer having openings on the first semiconductor layer; selectively forming a GaN-based semiconductor layer in the openings on the first semiconductor layer; forming a gate electrode on side faces of the GaN-based semiconductor layer; forming a source electrode or an emitter electrode on the GaN-based semiconductor layer; forming a drain electrode or a collector electrode connected on a surface of the first semiconductor layer that faces the GaN-based semiconductor layer or an opposite surface of the first semiconductor layer.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

In the conventional techniques described above, materials have different coefficients of thermal expansion. This is one reason of the warp or distortion on the substrate. Table 1 shown below explains the coefficients of thermal expansion of GaN used for the GaN-based semiconductor, AlN, SiC, silicon and, sapphire used for the substrate. The coefficients of thermal expansion of silicon and sapphire are largely different from those of GaN and AlN. SiC has a coefficient of thermal expansion that is different from those of GaN and AlN by approximately 10%. The GaN-based semiconductor film is usually formed at around 100° C. Therefore, even if the difference in the coefficient of thermal expansion is approximately 10%, the stress resulted from the coefficient of thermal expansion becomes greater at room temperature. A force of the stress multiplied by the thickness of the GaN-based semiconductor layer is applied to the substrate, and the substrate largely warps.

TABLE 1

| | Material | | | | |
|---|---|---|---|---|---|
| | GaN | AlN | SiC | Si | Sapphire |
| Coefficient ppm | 5.6(//a) 3.2(//c) | 4.5 | 5.0 | 2.6 | 7.0(//a) 7.7(//c) |

Figure 1A:
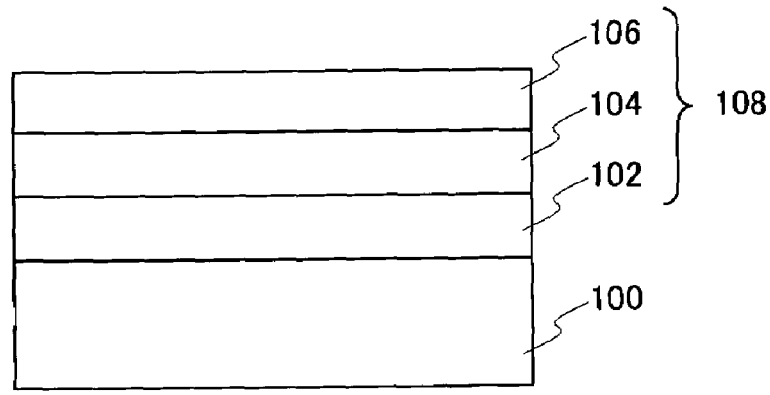
FIG. 1A through FIG. 1C are cross-sectional view showing a fabrication process in the conventional technique.
Figure 1B:
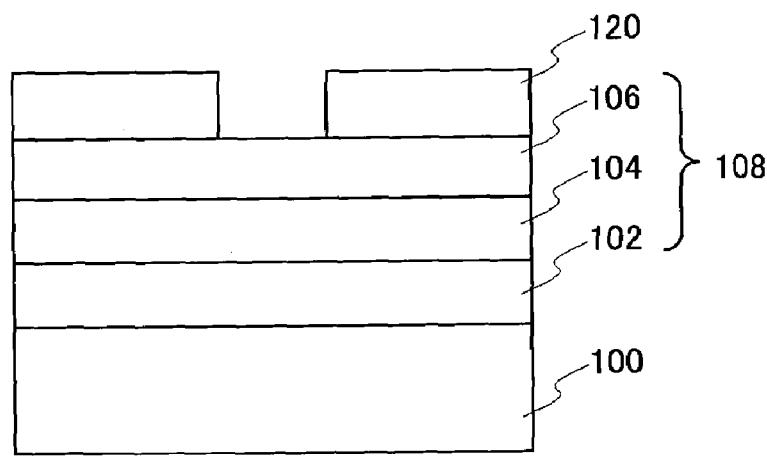
Figure 1C:
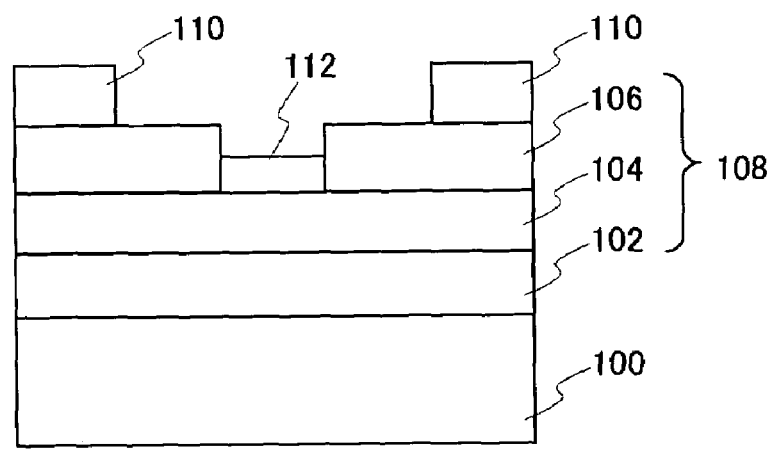
Figure 2A:
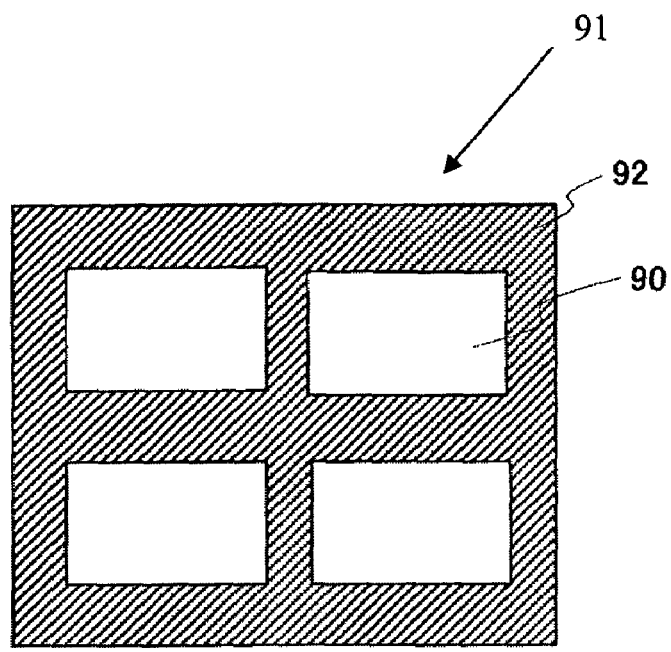
FIG. 2A through FIG. 2C are views showing a mask layer and openings thereof.

Referring now to FIG. 2A, a mask layer 92 is formed in such a manner that the GaN-based semiconductor layer is selectively grown only in island-shaped openings 90. A reference numeral 91 corresponds to a chip. This does not make the whole substrate distort or warp, even if the stress is generated resulting from the difference in the coefficients of thermal expansion between the substrate and the GaN-based semiconductor layer. Thus, it is possible to prevent the crack in the GaN-based semiconductor layer and the degradation of accuracy in the alignment in the fabrication process, which are caused resulting from the warp of the substrate. In addition, referring now to FIG. 2B, the GaN-based semiconductor layer is formed by the selective growth with the mask layer that serves as a mask, thereby enabling to prevent the deterioration of the electric characteristics caused by the etch damage when the opening portion is formed as seen in the conventional technique 1.

It is only necessary that the pattern of the mask layer bring the effect of preventing the warp of the substrate. Other than the island-shaped squares shown in FIG. 2A, for example, strips, triangles, hexagons, octagons, and dodecagons are applicable. As a mask layer, any material is applicable if the GaN-based semiconductor layer is difficult to be formed thereon. For instance, a silicon nitride film, titanium oxide film, and zirconium oxide film are applicable. The substrate also warps according to the difference in the coefficient of thermal expansion between the mask layer and the substrate. Therefore, it is preferable that the mask layer should have thickness of 100 nm or less.

Table 2 shows growth conditions for selectively growing the GaN semiconductor layer in island-shaped openings 90 on a sapphire (0001) substrate by MOCVD with the mask layer 92 that serves as a mask. Table 2 shows growth conditions A, B, C, D, and B that includes temperature, $NH_2$ flow rate, TMG (trimethylgallium) flow rate, and (11-22) facet growth rate. (11-22) facet growth rate is a rate of a growth area to a whole growth area.

TABLE 2

| | Condition | | | | |
|---|---|---|---|---|---|
| | A | B | C | D | E |
| Temperature (° C.) | 1050 | 1030 | 1000 | 1000 | 970 |
| NH3 flow rate (slm) | 2 | 2 | 3 | 4 | 4 |
| TMG flow rate(umol/min) | 10 | 10 | 10 | 20 | 40 |
| (11-22)facet growth ratio(%) | 0 | 20 | 40 | 80 | 100 |

In the condition A having 0% of the facet growth ratio, the GaN-based semiconductor layer does not grow on (11-22) plane. Accordingly, (0001) plane is grown (C plane growth). In the condition E having 100% of the (11-22) facet growth ratio, (11-22) plane is grown. Accordingly, (0001) plane is also grown whereas the area thereof is shrinking. In this manner, it is possible to select the facet growth, C plane growth, or an intermediate growth therebetween, according to the growth condition.

Hereinafter, a description will be given, with reference to drawings, of embodiments of the present invention.

First Embodiment

Figure 3A:
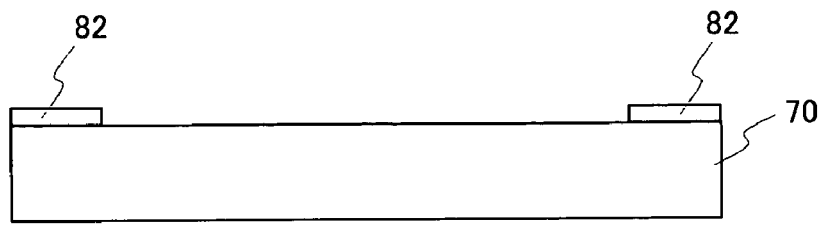
FIG. 3A through FIG. 3C are cross-sectional view showing a fabrication process in accordance with a first embodiment of the present invention.
Figure 3B:
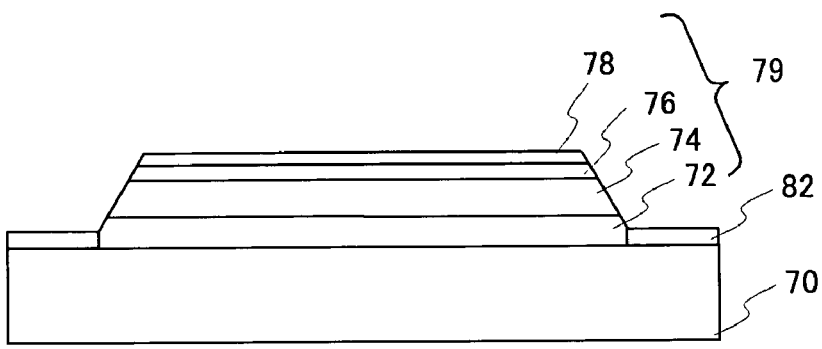
Figure 3C:
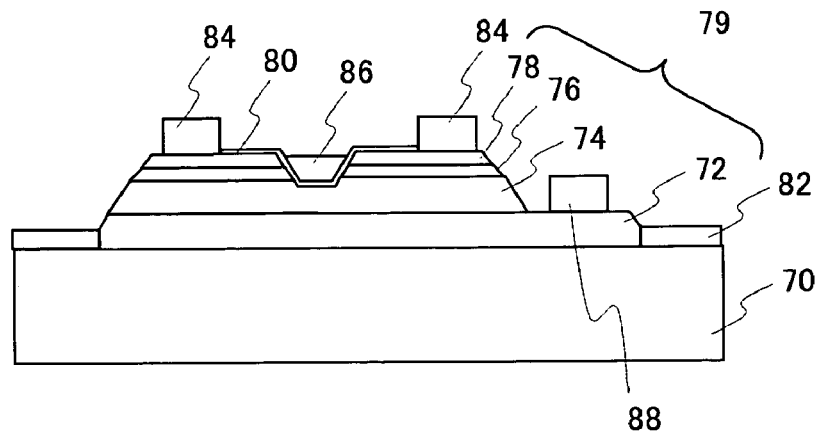

A first embodiment exemplarily describes the GaN-based semiconductor layer that is selectively provided on the substrate to form a transistor. FIG. 3A through FIG. 3C are cross-sectional views of the fabrication process in accordance with the first embodiment of the present invention. Referring now to FIG. 3A, a silicon oxide film that is used as a mask layer 82 is deposited on a sapphire substrate 70 by CVD, for example, and a given region is etched. In this manner, the mask layer 82 having openings is provided. The pattern at this time is similar to that shown in FIG. 2A.

Referring to FIG. 3B, a GaN-based semiconductor layer 79 is deposited by MOCVD on the substrate 70 other than the mask layer 82, which serves as a mask. The GaN-based semiconductor layer 79 includes an n-type GaN buffer layer 72, an n-type GaN drift layer 74, a p-type electron control layer 76, and an n-type GaN contact layer 78. The growth condition at this time is set to, for example, the condition A in Table 2.

Referring to FIG. 3C, an opening portion that reaches the drift layer 74 is formed in a given region by dry etching with $Cl_2$. An AlN cap layer 80 is deposited by MOCVD so as to cover the opening portion. A given region of the cap layer is removed to form source electrodes 84 with the use of Ti/Al, for example. A gate electrode 86 is made of Ni/Au is formed in the opening portion that reaches the drift layer 74 through the cap layer 80. A given region that includes the drift layer 74 is removed to form a drain electrode 88 with Ti/Al, for example.

In accordance with the first embodiment of the present invention, electrons are controlled by the gate electrode 86 to operate as a transistor, whereas the electrons travel from the source electrode 84 through the interface between the cap layer 80 and the contact layer 78 and that between the cap layer 80 and the electron control layer 76, and flow into the drift layer 74 in a vertical direction and reach the drain electrode 88.

In accordance with the first embodiment of the present invention, the GaN-based semiconductor layer 79 is formed to be the island-shaped regions, thereby enabling to prevent the warp of the substrate 70 that is caused resulting from the difference in the coefficients of the thermal expansion between the substrate 70 and the GaN-based semiconductor layer 79. It is thus possible to prevent the crack in the GaN-based semiconductor layer and the degradation in accuracy of alignment in the fabrication process.

Second Embodiment

Figure 4A:
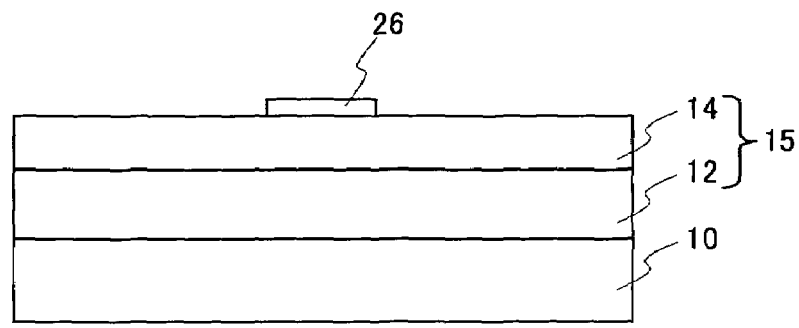
FIG. 4A through FIG. 4C are cross-sectional view showing a fabrication process in accordance with a second embodiment of the present invention.
Figure 4B:
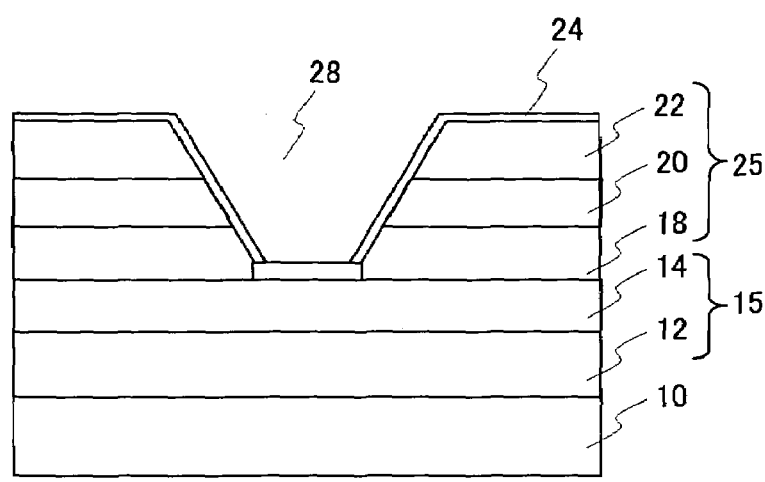
Figure 4C:
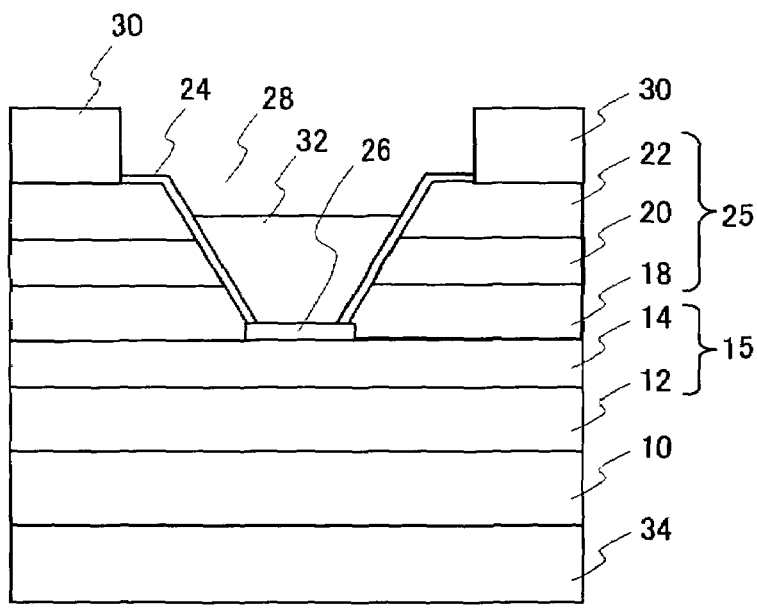

A second embodiment exemplarily describes a vertical FET. FIG. 4A through FIG. 4C are cross-sectional views of the fabrication process of the vertical FET in accordance with the second embodiment of the present invention. Referring to FIG. 4A, a first semiconductor layer 15 is deposited on the SiC substrate 10 having thickness of 400 μm and an n-type carrier density of $1\times10^{19}$ cm$^{-3}$ by MOCVD. The first semiconductor layer 15 includes the GaN buffer layer 12 having a film thickness of 500 nm and an n-type carrier density of $2\times10^{19}$ cm$^{-3}$ and a GaN drift layer 14 having a film thickness of 10 μm and an n-type carrier density of $2\times10^{16}$ cm$^{-3}$. That is to say, the first semiconductor layer 15 is an n-type semiconductor layer stacked on the n-type substrate 10.

Figure 2B:
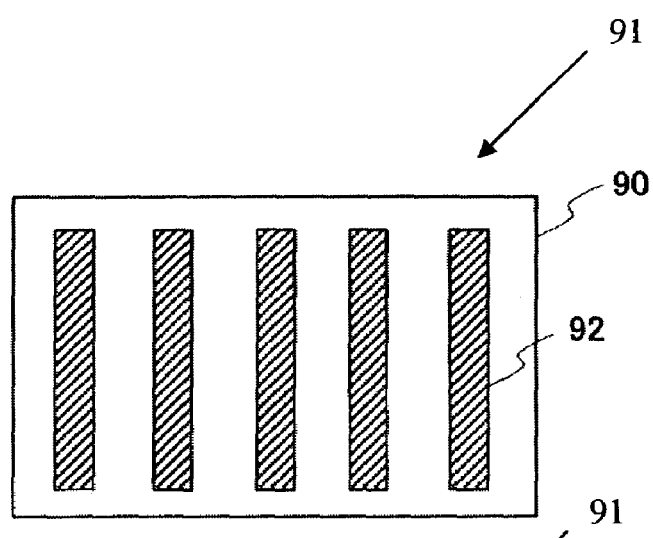

A silicon oxide film is deposited on the drift layer 14 by CVD, for example, a given region is removed, and a mask layer 26 having openings is formed. The mask layer 26 is formed to have island-like shapes as shown in FIG. 2B.

Referring to FIG. 4B, a GaN-based semiconductor layer 25 is deposited by MOCVD, for example, on the drift layer 14 without the mask layer 26, which serves as a mask. The GaN-based semiconductor layer 25 includes a spacer layer 18 having a film thickness of 100 nm and an n-type carrier density of $1\times10^{17}$ cm$^{-3}$, an electron control layer 20 having a film thickness of 100 nm and a p-type carrier density of $1\times10^{17}$ cm$^{-3}$, and a GaN contact layer 22 having a film thickness of 100 nm and an n-type carrier density of $2\times10^{19}$ cm$^{-3}$. At this time, the GaN-based semiconductor layer 25 can be selectively formed in a region where there is no mask layer 26. In this manner, the GaN-based semiconductor layer 25 has an opening portion 28. The GaN-based semiconductor layer 25 is grown under the condition E in Table 2, for example. Thus, the side faces of the opening portion 28 are inclined planes having (11-22) plane. An AlN cap layer 24 is formed 10 nm to cover the opening portion 28.

Referring to FIG. 4C, a given region of the cap layer 24 is removed, and then a source electrode 30 is formed on the GaN contact layer 22 with the use of Ti/Al, for example. A gate electrode 32 is provided on the cap layer 24 of the opening portion 28 with the use of Ni/Al, for example. That is to say, the gate electrode 32 is formed above side faces of the opening portion 28 in the GaN-based semiconductor layer 25 through the cap layer 24. The substrate 10 is polished to have the thickness of 100 μm, and a drain electrode 34 is formed on a back face thereof with the use of Ni/Al, for example. That is to say, the drain electrode 34 is connected on the side of an opposite surface of the drift layer 14 that faces the GaN-based semiconductor layer 25. As described heretofore, the transistor in accordance with the second embodiment of the present invention is completed. In this case, the drain electrode 34 may be formed on the drift layer 14 that faces the GaN-based semiconductor layer 25.

In accordance with the second embodiment of the present invention, the electrons are controlled by the gate electrode 32 to operate as a transistor, whereas the electrons travel from the source electrode 30 through the contact layer 22, the interface between the electron control layer 20 and the cap layer 24, the spacer layer 18, and the drift layer 14 in a vertical direction to reach the drain electrode 34 in the end.

In accordance with the second embodiment of the present invention, the GaN-based semiconductor device formed to be island-shaped prevents the substrate 10 from warping or distorting caused by the difference in the coefficients of thermal expansion between the substrate 10 and the GaN-based semiconductor device, thereby enabling to prevent the crack in the GaN-based semiconductor layer and the degradation in the accuracy of the alignment in the fabrication process. In addition, the opening portion 28 is provided in the GaN-based semiconductor layer 25 so as to form the gate electrode 32 by selectively forming the GaN-based semiconductor layer 25. Accordingly, it is possible to prevent the damage caused resulting from etching that is introduced into the side faces of the GaN-based semiconductor layer 25. Electrons travel through the interface between the electron control layer 20 and the cap layer 24. If the opening portion 28 is formed by dry etching as in the conventional technique, damage is introduced into the cap layer 24 and the electron control layer 20. This drastically degrades the electric characteristics of the transistor. In accordance with the second embodiment of the present invention, it is possible to prevent degradation of the electric characteristics.

Furthermore, the growth condition of the GaN-based semiconductor layer 25 is set to the condition E in Table 2, so that the opening portion 28 has the side faces of (11-22) plane. This makes it possible to fabricate the angle of the inclined surface with excellent repeatability. In a vertical FET, the gate length is determined by the angle of the side faces of the opening portion 28. Accordingly, the angle of the side face has considerable influence on the electric characteristics. It is thus possible to enhance the repeatability of the electric characteristics in accordance with the second embodiment of the present invention. A desired angle of the side face of the opening portion 28 is obtainable by selecting a desired facet growth rate.

Figure 2C:
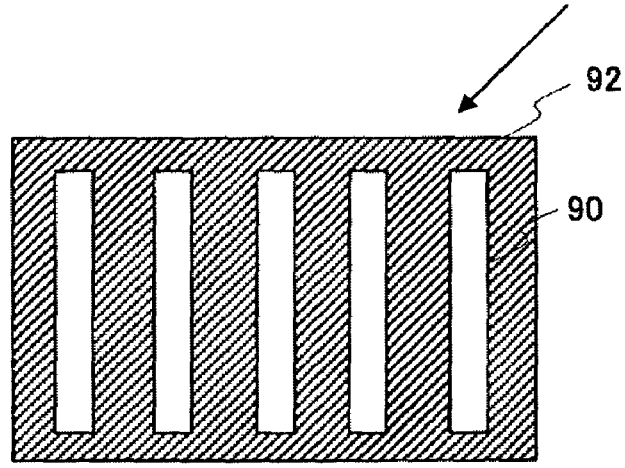
Figure 5A:
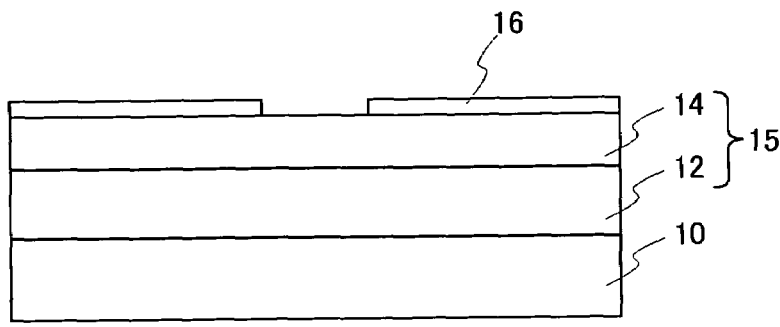
FIG. 5A through FIG. 5C are cross-sectional view showing a fabrication process in accordance with a variation example 1 of the second embodiment of the present invention.
Figure 5B:
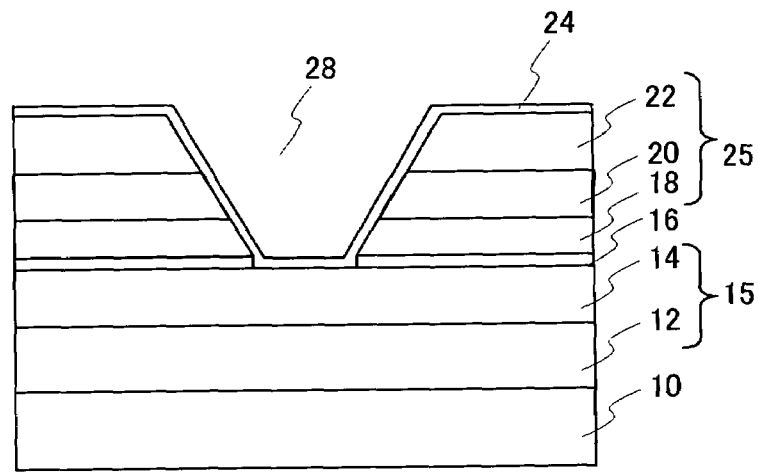
Figure 5C:
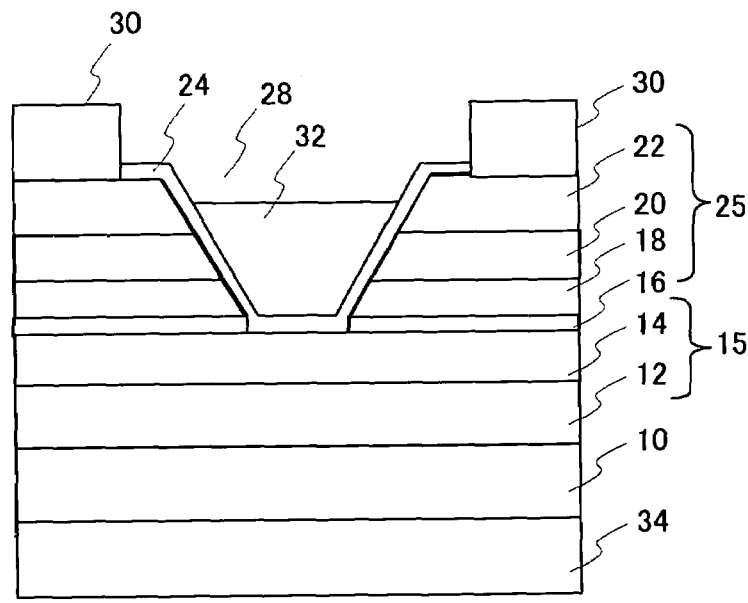

Here, a variation example 1 in accordance with the second embodiment is described. In the variation example 1, a seed layer 16 composed of AlN or AlGaN is used instead of the mask layer. FIG. 5A through FIG. 5C are cross-sectional views of the fabrication process in accordance with the variation example 1. Referring to FIG. 5A, the first semiconductor layer 15 is epitaxially grown on the SiC substrate 10, as in the second embodiment of the present invention. Then, the AlN or AlGaN layer (a semiconductor layer that includes AlN) is deposited by MOCVD, and a given region is removed by etching. In this manner, the seed layer 16 is provided. That is, the surface of the first semiconductor layer 15 is covered with the semiconductor layer that includes AlN, before the seed layer 16 is formed. The seed layer 16 also has an island-shaped pattern as shown in FIG. 2C, in which the island-shaped pattern shown in FIG. 2B is reversed.

Referring to FIG. 5B, with the use of the patterned seed layer 16, the GaN-based semiconductor layer 25 is selectively deposited on the seed layer 16 by MOCVD. At this time, the GaN-based semiconductor layer 25 is formed under the condition that the GaN-based semiconductor layer is grown on AlGaN, yet is difficult to be grown on GaN. The growth condition is set to the condition E in Table 2. In this manner, the GaN-based semiconductor layer 25 is provided on the seed layer 16. The GaN-based semiconductor layer 25 has a configuration same as that in accordance with the second embodiment of the present invention. Subsequently, the transistor shown in FIG. 5C is completed in the fabrication process same as that in accordance with the second embodiment of the present invention.

In the variation example 1, the effects are obtainable as seen in the second embodiment of the present invention. The effects include the prevention of crack in the GaN-based semiconductor device, the prevention of the degradation in accuracy of alignment in the fabrication process, the prevention of the degradation of the electric characteristics of the transistor, and the enhancement in the repeatability of the electric characteristics of the transistor. In addition, the AlGaN layer is used as the seed layer 16 and the GaN-based semiconductor layer 25 is selectively formed on the seed layer 16, thereby making it possible to grow the GaN-based semiconductor layer 25 in a region that is not exposed to etching while the pattern of the mask layer is being formed. This enables to provide the GaN-based semiconductor layer 25 having an excellent crystalline structure.

Figure 6A:
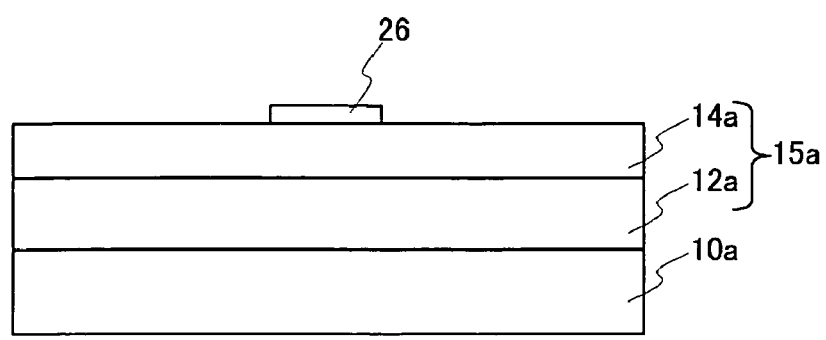
FIG. 6A through FIG. 6C are cross-sectional view showing a fabrication process in accordance with a variation example 2 of the second embodiment of the present invention.
Figure 6B:
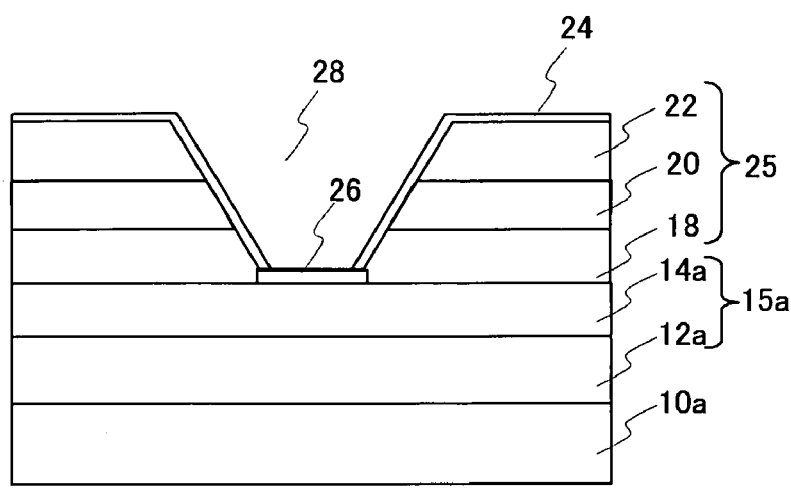
Figure 6C:
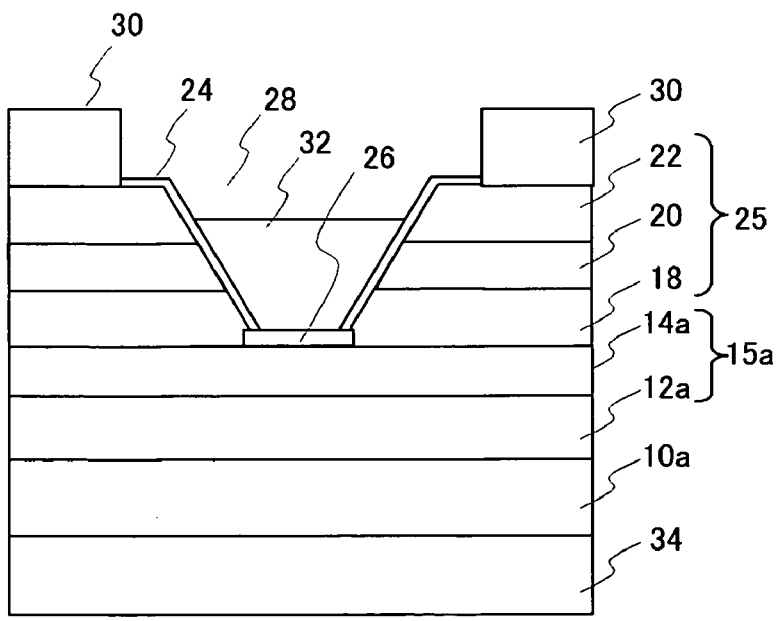

Next, a variation example 2 is described. The variation example 2 is an example having a SiC drift layer. FIG. 6A through FIG. 6C are cross-sectional views of the fabrication process of the transistor in accordance with the variation example 2. Referring to FIG. 6A, a first semiconductor layer 15a that includes a SiC buffer layer 12a and a SiC drift layer 14a is deposited by CVD on a SiC substrate 10a having thickness of 400 μm and an n-type carrier density of $1 \times 10^{19}$ cm$^{-3}$. The SiC buffer layer 12a has a film thickness of 500 nm and an n-type carrier density of $2 \times 10^{19}$ cm$^{-3}$. The SiC drift layer 14a has a film thickness of 10 μm and an n-type carrier density of $2 \times 10^{16}$ cm$^{-3}$. A silicon oxide film is deposited on the SiC drift layer 14a by CVD, for example, and a given region is removed to form a silicon oxide layer that serves as the mask layer 26 having openings. The mask layer 26 is formed as shown in FIG. 2B, for example.

Referring to FIG. 6B, the GaN-based semiconductor layer 25 is selectively deposited on the SiC drift layer 14a by MOCVD with the mask layer 26 used as a mask. The film structure and the fabrication method of the GaN-based semiconductor layer 25 are same as those described in the second embodiment of the present invention. Then, the fabrication process described in the second embodiment is implemented and the transistor shown in FIG. 6C is completed. Also in the variation example 2 having the SiC drift layer 14a, the effects are obtainable as seen in the second embodiment of the present invention. The effects include the prevention of crack in the GaN-based semiconductor device, the prevention of the degradation in accuracy of alignment in the fabrication process, the prevention of the degradation of the electric characteristics of the transistor, and the enhancement in the repeatability of the electric characteristics of the transistor. In addition, as described in the variation example 1, the AlGaN layer is used as the seed layer and the GaN-based semiconductor layer can be selectively formed on the seed layer. Also in this case, the GaN-based semiconductor layer 25 having an excellent crystal structure is obtainable as an effect, as described in the variation example 1.

Third Embodiment

Figure 7A:
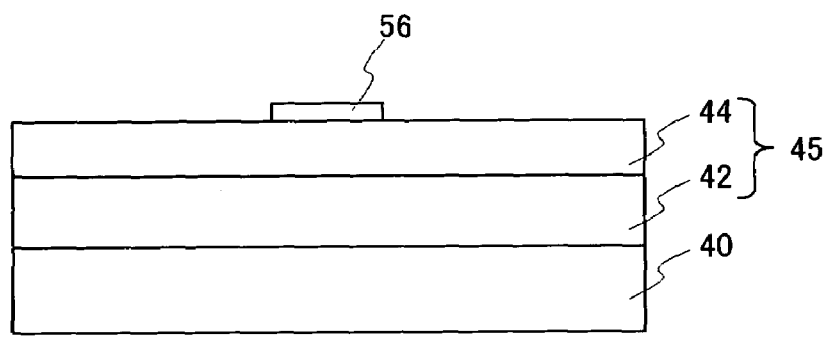
FIG. 7A through FIG. 7C are cross-sectional view showing a fabrication process in accordance with a third embodiment of the present invention.
Figure 7B:
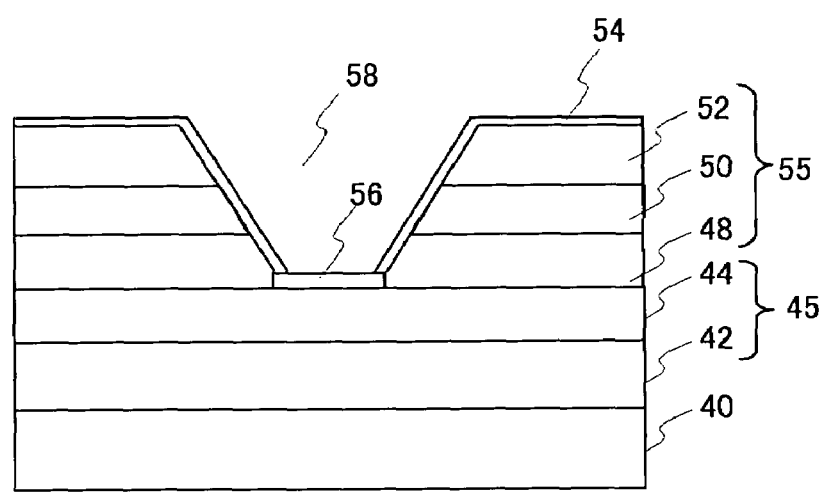
Figure 7C:
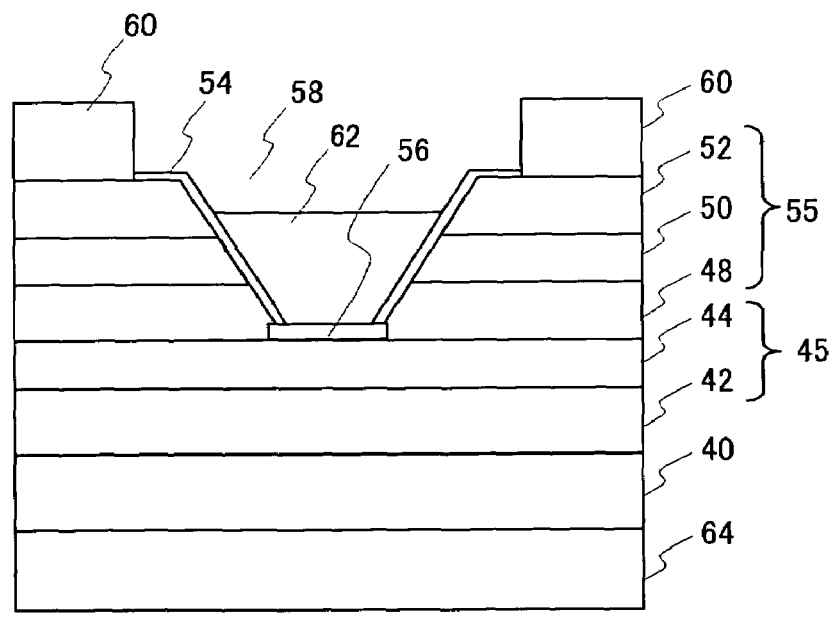

A third embodiment of the present invention is an example of IGBT (Insulated Gate Bipolar Transistor). FIG. 7A through FIG. 7C are cross-sectional views of the fabrication process of the transistor in accordance with the third embodiment of the present invention. Referring to FIG. 7A, a first semiconductor layer 45 that includes a p-type GaN buffer layer 42 and an n-type GaN drift layer 44 is deposited by MOCVD on (0001) plane of a p-type SiC substrate 40. That is to say, the first semiconductor layer 45 is composed of the p-type semiconductor layer formed on the p-type substrate 40 and the n-type semiconductor layer formed thereon. A silicon oxide film is deposited on the drift layer 44 by CVD, for example, and a given region is removed to form the silicon oxide layer as a mask layer 56 having openings. The mask layer 56 is formed as described in FIG. 2B, for example.

Referring now to FIG. 7B, a GaN-based semiconductor layer 55 is formed by MOCVD, for example, on the drift layer 44 except the mask layer 56 that serves as a mask. The GaN-based semiconductor layer 45 includes an n-type spacer layer 48, a p-type GaN electron control layer 50, and an n-type GaN contact layer 52. At this time, the GaN-based semiconductor layer 55 can be selectively formed in the opening portion of the mask layer 56. In this manner, the GaN-based semiconductor layer 45 has an opening portion 58. The GaN-based semiconductor layer 55 is grown, for example, on the condition E in Table 2. Thus, the side faces of the opening portion 58 are inclined planes having (11-22) plane. A cap layer 54 made of AlN or AlGaN is deposited by MOCVD or MBE so as to cover the opening portion 58.

Referring to FIG. 7C, a given region of the cap layer 54 is removed, and then an emitter electrode 60 is provided on the contact layer 52 with the use of Ti/Al, for example. A gate electrode 62 is provided on the cap layer 54 in the opening portion 58 with the use of Ni/Au, for example. That is to say, the gate electrode 62 is formed above the side faces of the opening portion 58 of the GaN-based semiconductor layer 55 through the cap layer 54. A collector electrode 64 is provided on a back face of the substrate 40 with the use of Ni/Au, for example. That is to say, the collector electrode 64 is connected on the side of an opposite surface of the drift layer 44 that faces the GaN-based semiconductor layer 55. The transistor in accordance with the third embodiment of the present invention is completed as described.

In accordance with the third embodiment of the present invention, also an IGBT having the GaN drift layer, the effects are obtainable as seen in the second embodiment of the present invention. The effects include the prevention of crack in the GaN-based semiconductor layer, the prevention of the degradation in accuracy of alignment in the fabrication process, and the prevention of the degradation of the electric characteristics of the transistor. In addition, it is possible to fabricate the angle of the side face of the opening portion 58 with excellent repeatability. This enables to manufacture the IGBT having excellent repeatability of the electric characteristics.

Figure 8A:
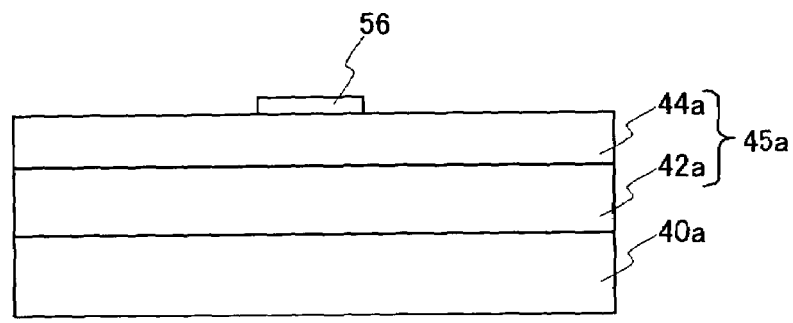
FIG. 8A through FIG. 8C are cross-sectional view showing a fabrication process in accordance with a variation example 1 of the third embodiment of the present invention.
Figure 8B:
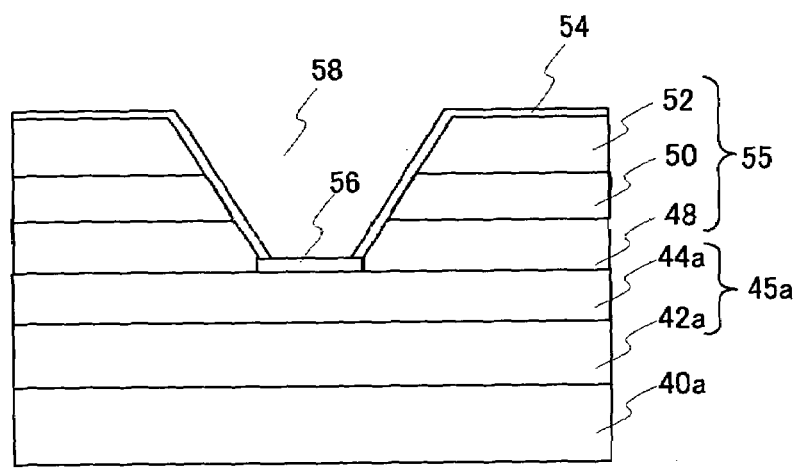
Figure 8C:
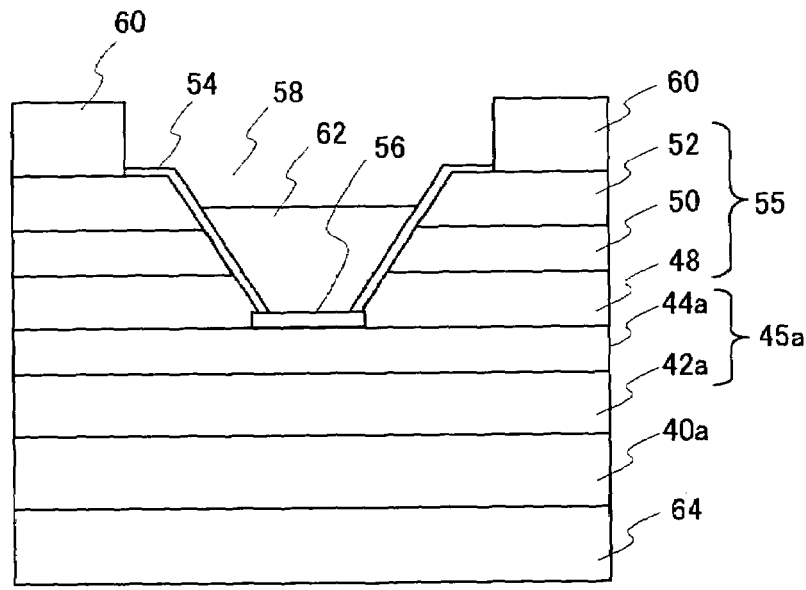

A variation example 1 in accordance with the third embodiment of the present invention is an example of IGBT having a SiC drift layer. FIG. 8A through FIG. 8C are cross-sectional views of the fabrication process of the transistor in accordance with the variation example 1 of the third embodiment of the present invention. Referring to FIG. 8A, a first semiconductor layer 45a that includes a p-type SiC buffer layer 42a and an n-type SiC drift layer 44a is deposited by CVD on (0001) plane of a p-type SiC substrate 40a. The silicon oxide film is deposited on the drift layer 44a by CVD, for example, and a given region is removed to form the mask layer 56 having openings. The mask layer 56 is formed as shown in FIG. 2B, for example.

Referring to FIG. 8B, the GaN-based semiconductor layer 55 is selectively formed by MOCVD, for example, in an opening portion of the mask layer 56 on the drift layer 44a except the mask layer 56 that serves as a mask. The structure and growth method of the GaN-based semiconductor layer 55 are same as those in accordance with the third embodiment of the present invention. Then, the transistor shown in FIG. 8C is completed in the fabrication process same as that in accordance with the second embodiment of the present invention. Also in the variation example 1 having the SiC drift layer, the effects are obtainable as seen in the third embodiment of the present invention. The effects include the prevention of crack in the GaN-based semiconductor device, the prevention of the degradation in accuracy of alignment in the fabrication process, and the prevention of the degradation of the electric characteristics of the transistor.

In accordance with the second embodiment, the third embodiment, and variation examples thereof of the present invention, on-resistance can be reduced by employing the GaN-based semiconductor layer for the electron control layer and fabricating a single crystal layer or mixed crystal layer composed of at least one of GaN, AlN, and InN, for example. This is because the afore-mentioned semiconductors have a high level of mobility. In addition, the electron controllability can be enhanced and the leakage current can be reduced by employing the GaN-based semiconductor layer for the cap layer having a wider band gap than that in the channel layer. The substrates 10 and 40 may employ a sapphire substrate, Si substrate, or a semiconductor substrate that includes GaN, in addition to the SiC substrate. This allows a growth having an excellent crystalline structure. Furthermore, the GaN-based semiconductor layer having a more excellent crystalline structure can be formed by employing MOCVD or MBE in order to deposit the GaN-based semiconductor layer.

The present invention is not limited to the above-mentioned embodiments, and other embodiments, variations and modifications may be made without departing from the scope of the present invention.

The present invention is based on Japanese Patent Application No. 2005-105163 filed on Mar. 31, 2005, the entire disclosure of which is hereby incorporated by reference.

What is claimed is:

1. A semiconductor device comprising:
a first semiconductor layer provided on a substrate;
a seed layer provided on the first semiconductor layer and having an opening, the seed layer including AlN;
a GaN-based semiconductor layer provided on the seed layer and defined by the seed layer;
a gate electrode provided on side faces of the GaN-based semiconductor layer;
a source electrode or an emitter electrode provided on the GaN-based semiconductor layer; and
a drain electrode or a collector electrode connected on a surface of the first semiconductor layer that faces the GaN-based semiconductor layer or below an opposite surface of the first semiconductor layer.

2. The semiconductor device as claimed in claim 1, wherein the substrate is one of a SiC substrate, a sapphire substrate, a Si substrate and a semiconductor substrate that includes GaN.

* * * * *